(12) United States Patent
Takemura

(10) Patent No.: US 6,437,366 B1
(45) Date of Patent: Aug. 20, 2002

(54) INSULATED GATE SEMICONDUCTOR DEVICE AND PROCESS FOR FABRICATING THE SAME

(75) Inventor: Yasuhiko Takemura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/441,669

(22) Filed: Nov. 17, 1999

Related U.S. Application Data

(62) Division of application No. 09/218,091, filed on Dec. 22, 1998, now Pat. No. 6,331,717, which is a division of application No. 08/942,440, filed on Oct. 1, 1997, which is a continuation of application No. 08/620,245, filed on Mar. 22, 1996, now abandoned, which is a division of application No. 09/286,290, filed on Aug. 5, 1994, now Pat. No. 5,530,265.

(30) Foreign Application Priority Data

Aug. 12, 1993 (JP) .............................. 5-220594

(51) Int. Cl.$^7$ .............................................. H01L 29/72
(52) U.S. Cl. .......................... 257/51; 257/52; 257/57; 257/66; 257/70; 257/347
(58) Field of Search .................... 257/51, 52, 57, 257/59, 66, 70, 347

(56) References Cited

U.S. PATENT DOCUMENTS

| 4,266,986 A | 5/1981 | Benton et al. |
| 4,377,421 A | 3/1983 | Wada et al. .................. 257/51 |
| 4,561,906 A | 12/1985 | Calder et al. |
| 4,619,034 A | 10/1986 | Janning |
| 4,651,408 A | 3/1987 | MacElwee et al. |
| 4,698,486 A | 10/1987 | Sheets ...................... 250/492.2 |
| 4,727,044 A | 2/1988 | Yamazaki ..................... 437/45 |
| 4,743,567 A | 5/1988 | Pandya et al. |

(List continued on next page.)

FOREIGN PATENT DOCUMENTS

| EP | 0 416 798 | 3/1991 |
| EP | 0 456 199 A2 | 11/1991 |
| EP | 0459 836 | 12/1991 |
| GB | 2 118 774 | 11/1983 |
| JP | 57-85262 | 5/1982 |
| JP | 58-2073 | 1/1983 |
| JP | 58-14524 | 1/1983 |
| JP | 58-147069 | 9/1983 |
| JP | 58-168278 | 10/1983 |
| JP | 58-190063 | 11/1983 |

(List continued on next page.)

OTHER PUBLICATIONS

Ultra LSI Process Data Handbook, published by Science Forum, (1982), pp. 526–527.

S. Inoue et al., "Low Temperature CMOS Self–Aligned Poly–Si TFTs and Circuit Scheme Utilizing New Ion Doping and Masking Techniques", IEEE, 556–IEDM 91, Dec. 8, 1991, pp. 20.1.1–20.1.4.

(List continued on next page.)

*Primary Examiner*—Edward Wojciechowicz
(74) *Attorney, Agent, or Firm*—Nixon Peabody LLP; Jeffrey L. Costellia

(57) ABSTRACT

A thin film transistor of reversed stagger type having improved characteristics and yet obtained by a simple process, which is fabricated by selectively doping the semiconductor region on the gate dielectric to form the source, drain, and channel forming regions by using ion implantation, ion doping, or doping a plasma of ions; and then effecting rapid thermal annealing by irradiating a ultraviolet radiation, a visible light, or a near-infrared radiation for a short period of time. The source, drain, and channel forming regions are formed substantially within a single plane.

51 Claims, 7 Drawing Sheets

U.S. PATENT DOCUMENTS

| | | | |
|---|---|---|---|
| 4,769,338 A | 9/1988 | Ovshinsky | 437/39 |
| 4,814,292 A | 3/1989 | Sasaki et al. | 437/101 |
| 4,885,258 A | 12/1989 | Ishihara et al. | 437/40 TFT |
| 4,888,305 A | 12/1989 | Yamazaki et al. | 437/101 |
| 4,959,700 A | 9/1990 | Yamazaki | 257/61 |
| 4,998,152 A | 3/1991 | Batey et al. | 257/57 |
| 5,061,642 A | 10/1991 | Fujioka | 437/11 |
| 5,070,379 A | 12/1991 | Nomoto et al. | 437/189 |
| 5,141,885 A * | 8/1992 | Yoshida et al. | 257/59 |
| 5,162,239 A | 11/1992 | Winer et al. | 437/4 |
| 5,198,379 A | 3/1993 | Adan | 437/41 |
| 5,208,476 A | 5/1993 | Inoue | 257/66 |
| 5,219,786 A | 6/1993 | Noguchi | 437/174 |
| 5,264,383 A | 11/1993 | Young | 437/40 TFT |
| 5,278,093 A | 1/1994 | Yonehara | 437/109 |
| 5,286,658 A | 2/1994 | Shirakawa et al. | 437/10 |
| 5,286,659 A | 2/1994 | Mitani et al. | |
| 5,313,077 A | 5/1994 | Yamazaki | |
| 5,315,132 A | 5/1994 | Yamazaki | |
| 5,329,140 A | 7/1994 | Sera | 257/51 |
| 5,340,999 A | 8/1994 | Takeda et al. | |
| 5,352,291 A | 10/1994 | Zhang et al. | 117/8 |
| 5,420,048 A | 5/1995 | Kondo | |
| 5,474,941 A | 12/1995 | Mitani et al. | |
| 5,474,942 A | 12/1995 | Kodaira et al. | |
| 5,495,824 A | 3/1996 | Yonehara et al. | |
| 5,529,937 A | 6/1996 | Zhang et al. | 437/10 |
| 5,530,265 A | 6/1996 | Takemura | |
| 5,541,128 A | 7/1996 | Kwasnick et al. | |
| 5,543,636 A | 8/1996 | Yamazaki | |
| 5,573,959 A | 11/1996 | Kodaira et al. | |
| 5,650,637 A | 7/1997 | Kodaira et al. | |
| 5,656,511 A | 8/1997 | Shindo | |
| 5,677,547 A | 10/1997 | Kodaira et al. | |
| 5,696,011 A | 12/1997 | Yamazaki et al. | |
| 6,037,608 A | 3/2000 | Kodaira et al. | |
| 6,316,790 B1 | 11/2001 | Kodaira et al. | |

FOREIGN PATENT DOCUMENTS

| | | |
|---|---|---|
| JP | 59-075670 | 4/1984 |
| JP | 60-136262 | 7/1985 |
| JP | 60-245124 | 12/1985 |
| JP | 60-245172 | 12/1985 |
| JP | 60-245173 | 12/1985 |
| JP | 60-245174 | 12/1985 |
| JP | 61-116820 | 6/1986 |
| JP | 61-135110 | 6/1986 |
| JP | 61-263273 | 11/1986 |
| JP | 62-2531 | 1/1987 |
| JP | 62-30379 | 2/1987 |
| JP | 62-104171 | 5/1987 |
| JP | 62-171160 | 7/1987 |
| JP | 62-205664 | 9/1987 |
| JP | 63-164 | 1/1988 |
| JP | 63-80570 | 4/1988 |
| JP | 63-168052 | 7/1988 |
| JP | 63-169767 | 7/1988 |
| JP | 63-227015 | 9/1988 |
| JP | 63-237577 | 10/1988 |
| JP | 01-235383 | 9/1989 |
| JP | 2-33934 | 2/1990 |
| JP | 2-177443 | 7/1990 |
| JP | 2-222545 | 9/1990 |
| JP | 2-272750 | 11/1990 |
| JP | 2-310932 | 12/1990 |
| JP | 03-034434 | 2/1991 |
| JP | 3-91932 | 4/1991 |
| JP | 03-126921 | 5/1991 |
| JP | 3-201538 | 9/1991 |
| JP | 3-203378 | 9/1991 |
| JP | 3-265143 | 11/1991 |
| JP | 4-186737 | 7/1992 |
| JP | 4-239732 | 8/1992 |
| JP | 04-269837 | 9/1992 |
| JP | 4-360580 | 12/1992 |
| JP | 05-102484 | 4/1993 |

OTHER PUBLICATIONS

Ultra LSI Process data Handbook, published by Science Forum, Apr. 15, 1982, pp. 567–568 (with English Abstract).

Kawachi et al., "Large–Area Doping Process for Fabrication of Poly–Si Thin Film Transistors Using Bucket Ion Source and XeCl Excimer Laser Annealing", Japanese Journal of Applied Physics, vol. 29, No. 12, Dec. 1990, pp. L2370–L2372.

S. Wolf et al., "Silicon Processing for the VLSI Era vol. 1: Process Technology", Lattice Press, Sunset Beach, CA, (1986), pp. 175, 178–179.

T. Sameshima et al., "XeCl Excimer Laser Annealing Used to Fabricate Poly–Si TFT's", Japanese Journal of Applied Physics, vol. 28, No. 10, Oct. 1989, pp. 1789–1793.

K. Sera et al., "High Performance TFT's Fabricated by XeCl Excimer Laser Annealing of Hydrogenated Amorphous–Silicon Film", IEEE Transactions on Electron Devices, vol. 36, No. 12, (1989), pp. 2688–2872.

McCullough et al., "Surface Roughness Effects in Laser Crystallized Polycrystalline Silicon", Appl. Phys. Lett., vol. 66, No. 16, Apr. 17, 1995, pp. 2060–2062.

* cited by examiner

Fig. 3

| No. | Process steps | |
|---|---|---|
| 1 | Substrate cleaning | |
| 2 | Depositing tantalum film | Sputter : 400 nm |
| 3 | Patterning gate wiring ① | Resist coating, Exposure, Development |
| 4 | Etching tantalum | Mixed acid (5% nitric acid + phosphoric acid) |
| 5 | Anodic oxidation of tantalum | 200 nm / 250 V |
| 6 | Resist stripping | Stripping solution |
| 7 | Forming silicon nitride film | PCVD : 200 nm |
| 8 | Substrate cleaning | |
| 9 | Depositing a-Si film | PCVD : 30 nm |
| 10 | Patterning a-Si ② | Resist coating, Exposure, Development |
| 11 | Etching a-Si | RIE : CF$_4$ |
| 12 | Resist ashing, stripping | Oxygen plasma, stripping solution |
| 13 | Substrate cleaning | |
| 14 | Forming silicon nitride film | PCVD : 200 nm |
| 15 | Patterning silicon nitride mask ③ | Resist coating, Exposure, Development |
| 16 | Etching silicon nitride mask | Hydrofluoric acid with Buffer (HF + NH$_4$F) |
| 17 | Introducing phosphorus ions | Ion doping : 3×10$^{15}$ cm$^{-2}$, 10 KeV |
| 18 | Substrate cleaning | |
| 19 | Resist ashing, stripping | Oxygen plasma, stripping solution |
| 20 | Lamp annealing | Halogen lamp |
| 21 | Removing mask from silicon nitride | Hydrofluoric acid with buffer |
| 22 | Substrate cleaning | |
| 23 | Forming aluminum film | Sputter : 400 nm |
| 24 | Patterning aluminum wiring ④ | Resist coating, exposure, development |
| 25 | Etching aluminum wiring | Mixed acid |
| 26 | Resist ashing, stripping | Oxygen plasma, stripping solution |

Fig. 4

| No. | Process steps | |
|---|---|---|
| 1 | Substrate cleaning | |
| 2 | Depositing aluminum film | Soutter : 400 nm |
| 3 | Patterning gate wiring ① | Resist coating, Exposure, Development |
| 4 | Etching aluminum | Mixed acid (5% nitric acid + phosphoric acid) |
| 5 | Anodic oxidation of aluminum | 200 nm / 250 V |
| 6 | Resist stripping | Stripping solution |
| 7 | Forming silicon nitride film (gate insulating film) | PCVD : 200 nm |
| 8 | Substrate cleaning | |
| 9 | Depositing a-Si film | PCVD : 30 nm |
| 10 | Patterning a-Si ② | Resist coating, Exposure, Development |
| 11 | Etching a-Si | RIE : CF$_4$ |
| 12 | Resist ashing, stripping | Oxygen plasma, stripping solution |
| 13 | Substrate cleaning | |
| 14 | Forming silicon nitride film | PCVD : 200 nm |
| 15 | Patterning silicon nitride mask ③ | Resist coating, Exposure, Development |
| 16 | Etching silicon nitride mask | Hydrofluoric acid with Buffer (HF + NH$_4$F) |
| 17 | Introducing phosphorus ions | Ion doping : 2×10$^{15}$ cm$^{-2}$, 10 KeV |
| 18 | Substrate cleaning | |
| 19 | Resist ashing, stripping | Oxygen plasma, stripping solution |
| 20 | Lamp annealing | Halogen lamp |
| 21 | Removing mask from silicon nitride | Hydrofluoric acid with buffer |
| 22 | Substrate cleaning | |
| 23 | Forming aluminum film | Sputter : 400 nm |
| 24 | Patterning aluminum wiring ④ | Resist coating, exposure, development |
| 25 | Etching aluminum wiring | Mixed acid |
| 26 | Resist ashing, stripping | Oxygen plasma, stripping solution |

Fig.5 (PRIOR ART)

| No. | Process steps |
|---|---|
| 1 | Substrate cleaning |
| 2 | Depositing tantalum film   Sputter : 400 nm |
| 3 | Patterning gate wiring ①   Resist coating, Exposure, Development |
| 4 | Etching tantalum   Mixed acid (5% nitric acid + phosphoric acid) |
| 5 | Anodic oxidation of tantalum   200 nm / 250 V |
| 6 | Resist stripping   Stripping solution |
| 7 | Forming silicon nitride film   PCVD : 200 nm (gate dielectric) |
| 8 | Substrate cleaning |
| 9 | Depositing a-Si film   PCVD : 30 nm |
| 10 | Patterning a-Si ②   Resist coating, Exposure, Development |
| 11 | Etching a-Si   RIE : CF₄ |
| 12 | Resist ashing, stripping   Oxygen plasma, stripping solution |
| 13 | Substrate cleaning |
| 14 | Forming silicon nitride film   PCVD : 200 nm |
| 15 | Patterning silicon nitride   Resist coating, Exposure, Development mask ③ |
| 16 | Etching silicon nitride mask   Hydrofluoric acid with Buffer |
| 17 | Forming n+ μ-Si film   PCVD : 500 nm |
| 18 | Patterning n+ μ-Si film ④   Resist coating, exposure, development |
| 19 | Etching n+ μ-Si film   RIE : CF₄ |
| 20 | Resist ashing, stripping   oxygen plasma, stripping solution |
| 21 | Substrate cleaning |
| 22 | Patterning n+ μ-Si film ⑤   Resist coating, exposure, development |
| 23 | Etching n+ μ-Si film   RIE : CF₄ |
| 24 | Resist ashing, stripping   Oxygen plasma, stripping solution |
| 25 | Substrate cleaning |
| 26 | Forming aluminum film   Sputter : 400 nm |
| 27 | Patterning aluminum wiring 6   Resist coating, exposure, development |
| 28 | Etching aluminum wiring   Mixed acid |
| 29 | Resist ashing, stripping   Oxygen plasma, stripping solution |

Fig. 6 (PRIOR ART)

| No. | Process steps |
|---|---|
| 1 | Substrate cleaning |
| 2 | Depositing aluminum film  Sputter : 400 nm |
| 3 | Patterning gate wiring ①  Resist coating, Exposure, Development |
| 4 | Etching aluminum    Mixed acid (5% nitric acid + phosphoric acid) |
| 5 | Anodic oxidation of aluminum   200 nm / 250 V |
| 6 | Resist stripping    Stripping solution |
| 7 | Forming silicon nitride film   PCVD : 200 nm (gate dielectric) |
| 8 | Substrate cleaning |
| 9 | Depositing a-Si film   PCVD : 30 nm |
| 10 | Forming silicon nitride film   PCVD : 200 nm |
| 11 | Patterning silicon nitride stopper   Resist coating, Exposure from rear surface, Development |
| 12 | Etching silicon nitride film   Hydrofluoric acid with Buffer |
| 13 | Resist ashing, stripping   oxygen plasma, stripping solution |
| 14 | Substrate cleaning |
| 15 | Forming n+ μ-Si film   PCVD : 500 nm |
| 16 | Patterning n+ μ-Si film ④ Resist coating, exposure, development |
| 17 | Etching n+ μ-Si or a-Si film   RIE : $CF_4$ |
| 18 | Resist ashing, stripping   oxygen plasma, stripping solution |
| 19 | Substrate cleaning |
| 20 | Forming aluminum film   Sputter : 400 nm |
| 21 | Patterning aluminum wiring ⑤ Resist coating, exposure, development |
| 22 | Etching aluminum wiring   Mixed acid |
| 23 | Resist ashing, stripping   Oxygen plasma, stripping solution |

INSULATED GATE SEMICONDUCTOR DEVICE AND PROCESS FOR FABRICATING THE SAME

This application is a Division of application Ser. No. 09/218,091, filed Dec. 22, 1998 now U.S. Pat. No. 6,331,717; which itself is a Division of Ser. No. 08/942,440 filed Oct. 1, 1997; which is a Continuation of Ser. No. 08/620,245 filed Mar. 22, 1996, abandoned; which is a Division of Ser. No. 08/286,290 filed Aug. 5, 1994, now U.S. Pat. No. 5,530,265.

BACKGROUND OF THE INVENTION

1. Field of the Invention

The present invention relates to an MIS (Metal-Insulator-Semiconductor) device, and particularly, to an MIS transistor. Specifically, the present invention relates to a thin film MIS-type semiconductor device formed on an insulating substrate, and more specifically, to a thin film transistor (TFT). In particular, the present invention relates to a MIS-type semiconductor device of a so-called reversed stagger type comprising a channel forming region on the upper side of a gate electrode. The present invention relates to a semiconductor integrated circuit formed on an insulating substrate, for example, an active matrix circuit and a driver circuit for image sensors.

2. Prior Art

Recently, devices comprising a thin film MIS-type semiconductor device formed on an insulating substrate are brought into practical use. Such a device can be found, for instance, in an active matrix-addressed liquid crystal device. Active matrix circuits commercially available at present include a type using a TFT and a type using a diode such as a MIM. In particular, the active matrix circuits of the former type are fabricated more actively because of the high quality image they yield.

Known active matrix circuits utilizing TFTs include those using polycrystalline semiconductors such as polycrystalline silicon and those using amorphous semiconductors such as amorphous silicon. A TFT using amorphous silicon is referred to hereinafter as an "amorphous silicon TFT". However, the TFTs of the former type cannot be applied to large area displays because of the process limitations. Accordingly, those of the latter type that are fabricated at a process temperature of 350° C. or lower are mainly used for large area displays.

Referring to FIGS. 2(A) to 2(D), a process for fabricating a prior art amorphous silicon TFT of a reversed stagger type is described below. An alkali-free heat-resistant glass such as a Corning 7059 glass is used for the substrate 201. Since an amorphous silicon TFT is fabricated by a process with a maximum temperature of about 350° C., materials well resistant to the maximum temperature must be used. In case of using the TFT in a liquid crystal panel, a material having a sufficiently high heat resistance and a high glass transition temperature must be employed to prevent thermal deformation from occurring on the substrate. From this context, Corning 7059 glass is suitable as a substrate material because it undergoes glass transition at a temperature slightly below 600° C.

A TFT capable of stable operation can be realized by excluding mobile ions such as sodium ions from the substrate. The Corning 7059 glass contains very low alkali ions and is therefore ideal from this point of view. If a substrate containing considerable amount of an alkali ion such as sodium ion were to be used, a passivation film made from, for example, silicon nitride or aluminum oxide must be formed on the substrate to prevent mobile ions from intruding into the TFT.

After a coating is formed on the substrate using an electrically conductive material such as an aluminum or tantalum, a tantalum electrode 202 is formed by patterning using a mask 1. An oxide film 203 is formed on the surface of the gate electrode to prevent short circuit from occurring between the upper wiring and the gate electrode with wiring. The oxide film can be formed mainly by anodic oxidation. In such a case, the oxide film can be formed by applying a positive voltage to the electrode 202 in an electrolytic solution to oxidize the surface of the gate electrode.

A gate dielectric 204 is formed thereafter. In general, silicon nitride is used as the gate dielectric. However, the material for the gate dielectric is not only limited thereto, and it may be silicon oxide or a silicide containing nitrogen and oxygen at a desired ratio. The gate dielectric may be a film of single layer or a multilayered film. A plasma CVD process, for example, can be applied in case silicon nitride film is used as the gate dielectric. The plasma CVD process is effected at a temperature of about 350° C., i.e., the maximum temperature of the present step. The structure thus obtained is shown in FIG. 2(A).

An amorphous silicon film is formed thereafter. If the amorphous silicon film is deposited by plasma CVD, the substrate is heated to a temperature in the range of from 250 to 300° C. The film is formed as thin as possible; specifically, it is formed generally at a thickness of from 10 to 100 nm, and preferably, in the range of from 10 to 30 nm. The amorphous silicon film is patterned using a mask ② to form an amorphous silicon region 205. The amorphous silicon region 205 thus formed provides the channel forming region in the later steps. The resulting structure is shown in FIG. 2(B).

A silicon nitride film is formed on the entire surface of the resulting structure, and is patterned using a mask ③ to provide an etching stopper 206. The etching stopper is provided to prevent accidental etching from occurring on the amorphous silicon region 205 in the channel forming-region, because the amorphous silicon region 205 is provided thinly, as mentioned above, at a thickness of from 10 to 100 nm. Moreover, the etching stopper is designed in such a manner that it may be formed superposed on the gate electrode because the amorphous silicon region under the etching stopper functions as the channel forming region. However, misalignment occurs at some extent in the conventional mask alignment. Accordingly, the etching stopper is patterned in such a manner that it may be sufficiently superposed on the gate electrode (i.e., in such a manner that the etching stopper may be smaller than the gate electrode).

An N-type or P-type conductive silicon coating is formed thereafter. In general, an amorphous silicon TFT is of an N-channel type. Since the electric conductivity of an amorphous silicon film thus formed is insufficiently low in conductivity, a microcrystalline silicon film is used alternatively. An N-type conductive microcrystalline silicon film can be fabricated at a temperature of 350° C. or lower by plasma CVD. Still, however, an N-type microcrystalline silicon film must be formed at a thickness of 200 nm or more because the resistance thereof is not sufficiently low. A P-type microcrystalline silicon film has an extremely high resistance and cannot be used as it is. Accordingly, it is difficult to fabricate a P-channel TFT from amorphous silicon.

The silicon film thus fabricated is patterned thereafter using a mask ④ to provide an N-type microcrystalline silicon region 207. The resulting structure is shown in FIG. 2(C).

The structure of FIG. 2(C), however, cannot function as a TFT because the N-type microcrystalline silicon film is joined over the etching stopper. It is therefore necessary to separate the structure at the silicon film joint. Thus, the structure is separated using a mask ⑤ to form a trench 208. If an etching stopper is not provided on the amorphous silicon layer, the base amorphous silicon layer may be accidentally damaged by the etching, because the microcrystalline silicon region 207 is several to several tens of times as thick as the underlying amorphous silicon region, or even thicker.

A wiring 209 and a-pixel electrode 210 are formed thereafter by a known process using masks ⑥ and ⑦ state of the resulting structure is shown in FIG. 2(D).

In the process above, however, the yield may be lowered because such a large number of masks amounting to 7 are used in the process. Thus, to decrease the number of masks, it is proposed to pattern the gate electrode portion using a first mask on the substrate. Then, a gate dielectric is formed to further deposit continuously thereon an amorphous silicon film and a silicon nitride film to later provide an etching stopper. The structure is exposed thereafter from the back to form an etching stopper in a self-aligned manner by selectively etching the silicon nitride film alone using the gate electrode portion as the mask. A TFT region inclusive of the trench on the upper portion of the channel (corresponding to the region 208 in FIG. 2) is formed using a second mask after forming a microcrystalline silicon film thereon. Then, a third and a fourth mask are used to form the wiring and the electrode. A structure equivalent to that shown in FIG. 2(D) is finally obtained. It can be seen that a complete structure is obtained using less number of, masks, i.e., 3 masks, by fully taking advantage of the self-aligned process.

As is seen in the figure, the TFT obtained above comprises irregularities. This is mainly due to the gate electrode portion (inclusive of the oxide 203 on the gate electrode), the etching stopper, and the microcrystalline silicon region. More specifically, for instance, a gate electrode portion having a thickness of 300 nm, an etching stopper 200 nm in thickness, and a microcrystalline silicon region 207 formed at a thickness of 300 nm in total yield an elevation as high as 800 nm in height on the substrate.

Considering a case the TFT is used as an active matrix circuit for a liquid crystal display panel, for example, the cell is generally about 5 to 6 $\mu$m in thickness and is controlled within a precision of 0.1 $\mu$m or less. Under such conditions, an irregularity as to reach a height of 1 $\mu$m considerably impairs the uniformity of the cell thickness.

The factors affecting the thickness uniformity cannot be easily removed. For example, if the microcrystalline silicon film were to be formed thinly, the resistance of the source and drain is reversely increased to lower th e device quality.

If a thin etching stopper were to be formed, on the other hand, the amorphous silicon region under the microcrystalline region may be accidentally etched during the etching process. If such an unfavorable etching should occur, the product yield may thereby be lowered.

SUMMARY OF THE INVENTION

The present invention has been accomplished in the light of the aforementioned circumstances. Accordingly, an object of the present invention is to simplify the process for manufacturing a semiconductor device. For instance, the number of masks is reduced to increase the yield. Otherwise, cost can be reduced by decreasing the number of film deposition steps to increase the throughput.

Another object of the present invention is to provide a semiconductor device such as a TFT having a further planarized surface. TFTs having a smooth surface not only resolve the problem in applying them to liquid crystal display panels, but also provides a solution to the key technical problems in other applications. Such TFTs with planarized structure allow them to be applied to novel application fields to which the prior art TFTs were not applicable.

A still other object of the present invention is to improve the TFT characteristics. The source/drain regions of the TFT shown in FIG. 2 yield a high sheet resistance which impairs the characteristics of the TFT. Moreover, the joint adhesiveness between the source/drain regions and the channel forming region is extremely poor because the source/drain regions are made from a material differing from that constituting the channel-forming region. It is also impossible to continuously form the source/drain regions after depositing the channel forming region. Thus, ideally, the joint adhesiveness between the source/drain regions and the channel forming region is improved by forming them from a single film within a same plane as in the MOS transistor of a semiconductor integrated circuit.

The aforementioned objects can be accomplished by a novel process for fabricating a TFT without using any etching stoppers, and by a TFT fabricated by the same process. More specifically, the resistance of the microcrystalline region (source/drain) is lowered sufficiently while increasing the thickness thereof. Furthermore, instead of a prior art two step process comprising forming an amorphous silicon region (film) for the channel forming region and a microcrystalline region (film) for the source/drain regions, the process according to the present invention comprises forming a single silicon film, and then separately forming the source/drain regions partly in the silicon film while forming the channel forming region in the other part thereof.

The throughput can be increased by solving the key problem of reducing the film deposition steps. The film deposition steps not only take time, but also consume considerable time which is equivalent to the time duration of the film deposition for cleaning inside the film deposition chamber. That is, a practical semiconductor process performed under an absolutely clean condition requires a long time to clean the chamber, and hence, the film deposition is effected during the spare time between the cleaning steps. It can be seen that an increase in throughput can be realized by forming thin coating instead of thick one, and by depositing a single layer coating instead of multilayered one. Thus, from the viewpoint of increasing the throughput, the film deposition steps are preferably reduced.

A TFT according to an embodiment of the present invention is an insulated gate transistor of reversed stagger type MIS TFT comprising a gate electrode coated with a gate dielectric and having thereon a semiconductor film, provided that the upper portion of the gate electrode is made from a substantially intrinsic semiconductor which provide a channel forming region. The other portions are either N-type or P-type conductive to provide source/drain regions having a structural degree of ordering higher than that of amorphous semiconductor of the channel forming region. The N-type or P-type semiconductor comprises a crystalline semiconductor which exhibits structural ordering as observed by a peak in Raman scattering spectra. The channel forming region may be amorphous, semi-amorphous, microcrystalline, polycrystalline, or may take an intermediate state between any two states enumerated above. The use of an amorphous semiconductor is preferred in case a suppressed OFF current is desirable. The regions which function as source and drain are made from crystalline silicon having a sufficiently low resistance. Furthermore, these regions are rendered crystalline and the crystal structure thereof is ameliorated by irradiating a laser light or an intense light equivalent thereto from 4 to 0.5 $\mu$m in wavelength to the regions for a short period of time; the light specifically including an ultraviolet radiation; a visible light, and a near infrared radiation. These regions are rendered P-type or N-type by the irradiation of the ultraviolet radiation, the visible light or the near infrared radiation thereto according to the impurity introduced thereinto.

It can be seen that the structure above can be implemented by a single semiconductor film. Thus, the process above can be found suitable for mass production. Moreover, the surface irregularities of the TFT can be, reduced because, unlike to the prior art processes, a thick microcrystalline silicon film is excluded from the process according to the present invention. As a matter of course, the process according to the present invention does not always require the impurity regions, for example, the channel forming region and the source/drain regions, be formed in a single semiconductor layer. Thus, those impurity regions may take a multilayered structure comprising two or more semiconductor layers to further improve the device characteristics while taking the cost and the performance into consideration. It should be noted, however, that in both cases, the source/drain regions as well as the channel forming region must be formed substantially in a single plane (layer).

A TFT according to-another embodiment of the present invention is characterized in that no etching stopper is formed on the upper portion of the channel forming region. In this manner, the greatest factor for forming the surface irregularities can be eliminated from the TFT.

BRIEF EXPLANATION OF THE DRAWINGS

FIG. 3 shows the step sequential process steps of a TFT according to Example 1 of the present invention;

FIG. 4. shows the step sequential process steps of a TFT according to Example 2 of the present invention;

FIG. 5 shows the step sequential process steps of a TFT obtained according to a prior art process;

FIG. 6 shows the step sequential process steps of a TFT obtained according to another prior art process.

DETAILED DESCRIPTION OF THE PREFERRED EMBODIMENTS

Figure 1A:
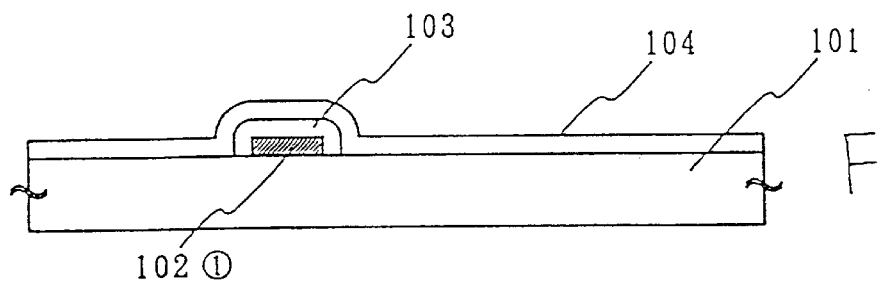
FIGS. 1(A) to 1(D) show schematically drawn step-sequential cross section structures obtained in a process for fabricating a TFT according to an embodiment of the present invention.
Figure 1B:
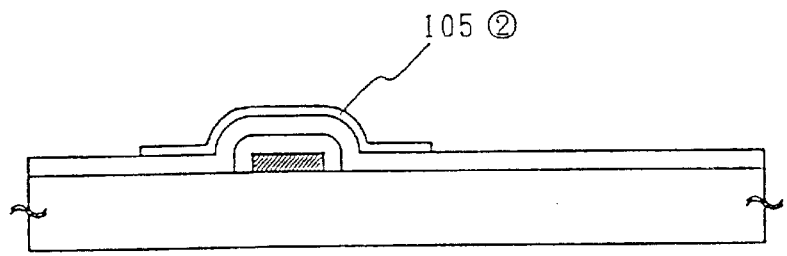

A TFT according to the present invention can be fabricated by following the process steps illustrated schematically in FIGS. 1(A) to 1(D). However, the process according to the present invention is not only limited thereto, and modifications can be added thereto. Referring to FIG. 1(A), a gate electrode 102 is patterned on a heat-resistant alkali-free glass (e.g., a Corning 7059 glass) insulating substrate 101 using a mask ①. If necessary, an oxide film 103 can be formed on the surface of the gate electrode to improve the insulating properties. A gate dielectric (gate insulating film) 104 is formed thereafter to realize a structure as illustrated in FIG. 1(A).

A thin film of an amorphous, a semi-amorphous, a microcrystalline, or a polycrystalline silicon, or of a silicon in an intermediate state between any two states selected from those enumerated, is deposited thereafter and patterned using a mask ② to give a semiconductor region 105. In practice, an amorphous silicon film is formed considering the film deposition temperature and the OFF current (leak current), however, the amorphous silicon film thus obtained may be further subjected to low temperature crystallization process such as laser annealing to form a polycrystalline or a semiamorphous silicon film. The use of a polycrystalline silicon or a semi-amorphous silicon certainly increases the field mobility, however, it also increases the OFF current to make it unsuitable for an active matrix circuit of a liquid crystal display panel.

Figure 1C:
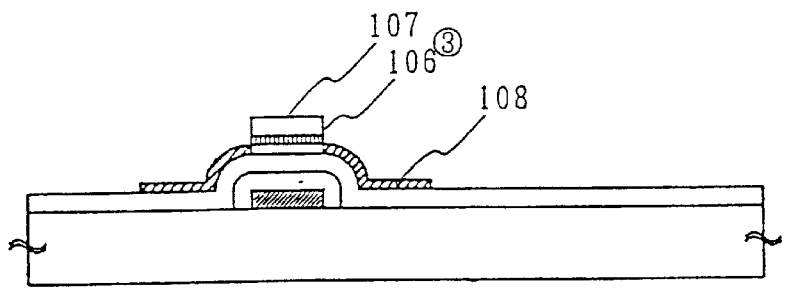

Then, a coating for providing a masking material for an ultraviolet radiation, a visible light, or a near-infrared radiation, a silicon-rich silicon nitride film, for example, is formed at a thickness of, preferably, 50 nm or more. The resulting masking material is patterned using a mask ③. A photoresist may be left out on the silicon nitride film at the same time. Referring to FIG. 1(C), a photoresist 107 is provided on a silicon nitride film 106. By-taking the later steps of ion implantation, the photoresist is provided at a thickness of 100 nm or more, and preferably, 500 nm or more.

Impurities are implanted selectively into the semiconductor region 105 by ion implantation, ion doping, or by doping a plasma of an ion. An impurity region 108 is formed in this manner. However, the ion implantation process considerably impairs the crystallinity of the semiconductor film as to completely deprive the film of the semiconductive functions. Thus, the damaged film is subjected to crystallization (i.e., lamp annealing, rapid thermal annealing (RTA)) by irradiating an ultraviolet radiation, a visible light, a near-infrared radiation, or a laser radiation to the film from the upper side for a short period of time. The structural ordering of the semiconductor is recovered by this step to realize a further improved crystalline state as compared with the state before introducing the impurities. Silicon at various states ranging from a polycrystalline state similar to a single crystal state to a semiamorphous state can be formed in this step of lamp annealing by properly controlling the duration of light irradiation, the temperature of the object subjected to annealing, and the atmospheric conditions. The crystallinity of the silicon thus obtained by lamp annealing can be confirmed by observing the characteristic peak in Raman scattering spectroscopy.

The crystallinity of the silicon film can be improved, more specifically, by irradiating a light whose wavelength falls within a range from a ultraviolet region to a visible light, and further to a near-infrared region, more preferably, in the range of from 4 to 0.5 $\mu$m, for instance, an infrared light having a peak at a wavelength of 1.3 $\mu$m) for a duration of a relatively short period of time, i.e., from 10 to 1,000 seconds. Such a light may be irradiated to the N-type or P-type semiconductor. The light which is used in this step is preferably such having a wavelength absorbable by the silicon film but not substantially absorbed by the glass substrate. Otherwise, a laser radiation can be irradiated to the silicon film to improve the crystallinity thereof.

A light having a wavelength in the visible light region, and particularly a light having a short wavelength less than 0.5 $\mu$m, can be readily absorbed by an intrinsic or a substantially intrinsic amorphous silicon. The absorptivity of the intrinsic or substantially intrinsic amorphous silicon, however, decreases with increasing wavelength. On the other hand, the light in the wavelength range of from 0.5 to 4 $\mu$m is effectively absorbed by an impurity-doped amorphous silicon film, however, it is hardly absorbed by the glass substrate. Hence, the impurity-doped region alone can be effectively heated in the TFT by using a light from 0.5 to 4 $\mu$m in wavelength. Needless to say, the lamp annealing step can be effected by irradiating the light from either the upper side or the substrate side, or from the both sides.

The silicon film frequently undergoes separation (peeling off) from the substrate during thermal treatment due to the difference in the thermal expansion coefficient between the silicon film and the substrate or to the difference in temperature between the silicon film surface and the boundary between the substrate and the silicon film. The film separation occurs most frequently in case the film is formed over a large area covering the entire surface of the substrate. In the process according to the present invention, however, the film is divided into a plurality of sufficiently small-area portions and is thereby free from the problems of film separation and the like. Moreover, the entire surface of the substrate is not heated through the silicon film. Accordingly, thermal shrinking of the substrate can be fully suppressed. In the heat treatment, the duration of lamp annealing is as shortened as possible to maintain the substrate and the like as free as possible from the thermal influence cast by lamp annealing.

The gate electrode must be made from a material resistant to the step of lamp annealing. Accordingly, a metal having a high melting point, such as tantalum and titanium, is preferred. Aluminum readily undergoes deformation at high temperatures, but it resists to an annealing for a short period of time so long as the aluminum is coated with a sufficiently thick film of anodic oxide.

The present inventors have found through experimentation that the impurities deep inside a specimen can be activated by heating the specimen in the temperature range of from about 250 to 500° C. in the lamp annealing step. Thus, the impurity concentration can be sufficiently increased in this manner. It is preferred to maintain the specimen in a temperature range of from 250 to 350° C., because an excessively high temperature range is not favorable for maintaining the silicon of the channel forming region in an amorphous state, and because of the limitation of the glass substrate.

The silicon nitride film 106 and the photoresist 107 are removed after thus effecting doping. The silicon nitride film 106 can be left over as it is. A wiring 110 and an ITO pixel electrode 111 are formed thereafter by a known process by using a mask ④ and a mask ⑤. The number of masks necessary for the process in total is five, however, it can be reduced to four by taking advantage of a self-aligned method using a conventional technique of light exposure from the back of the gate electrode. More specifically, one mask each is necessary for forming the gate electrode and for forming the semiconductor region, and two masks for forming the pixel electrode and wiring. The silicon nitride mask 106 can be patterned by effecting back exposure using the gate electrode as the mask.

Figure 1D:
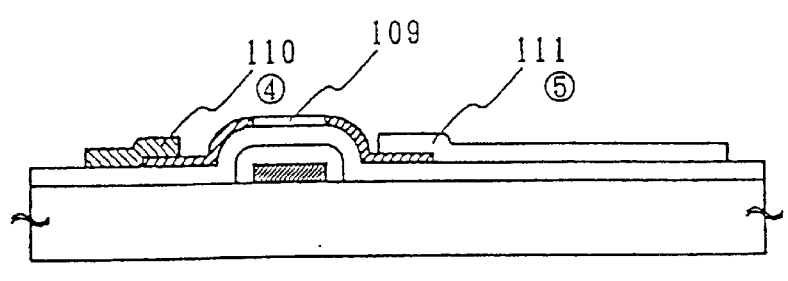
Figure 2A:
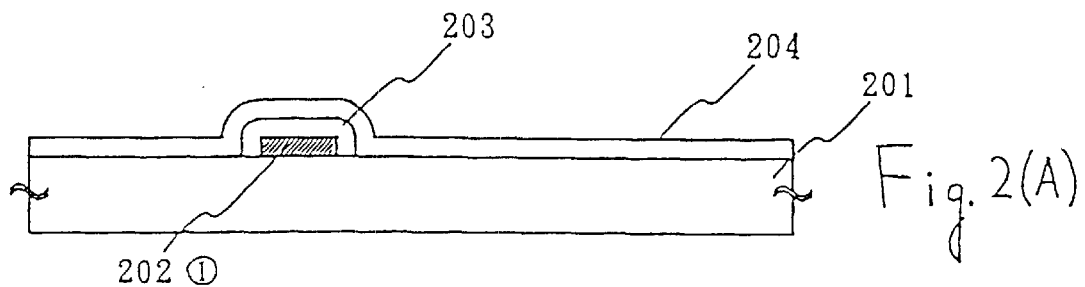
FIGS. 2(A) to 2(D) show schematically drawn step-sequential cross section structures obtained in a prior art process for fabricating a TFT.
Figure 2B:
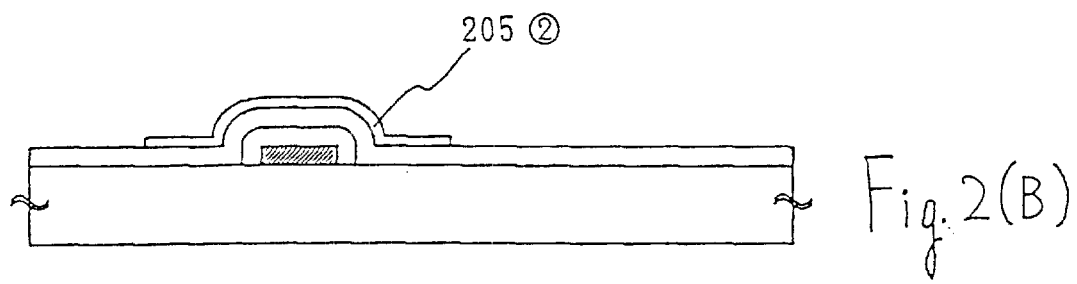
Figure 2C:
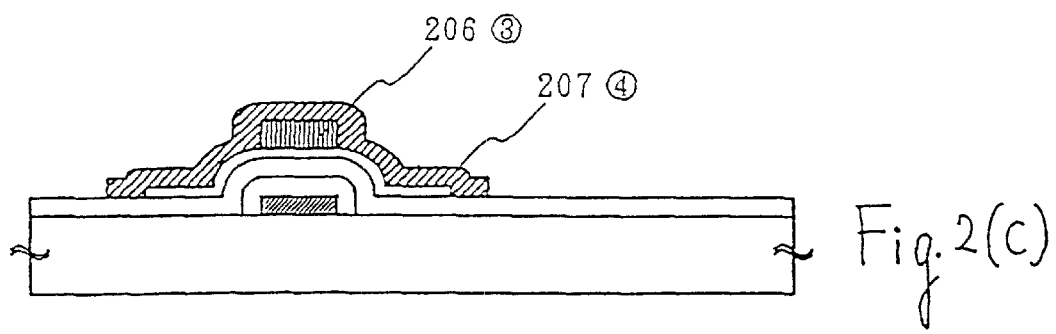
Figure 2D:
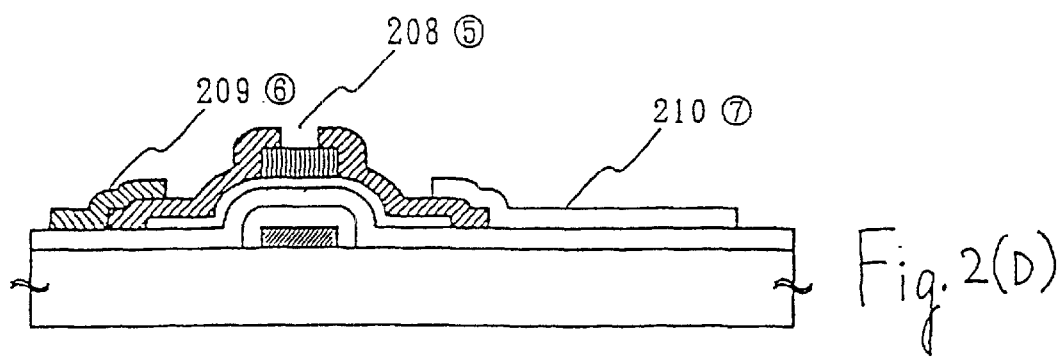

Referring to FIG. 1(D), the surface irregularities of the TFT according to the present invention is reduced as compared with those of a conventional TFT. This is because the irregularities of the entire TFT is attributed to the irregularities of the gate electrode portion alone. The irregularities of the semiconductor region 105 does not contribute to the entire structure because it is provided extremely thin in a thickness range of from 10 to 100 nm as in a conventional TFT.

As described in the foregoing, the present invention is characterized in that the semiconductor region, i.e., the source/drain regions, can be provided extremely thin because the region has a sufficiently high impurity concentration and a favorable crystallinity. This is achieved because a lamp annealing step is employed in the process of the present invention. Moreover, the etching stopper, which was indispensable in a prior art process, can be omitted from the process of the present invention. it can be also noted that the structural irregularities can be considerably reduced in the TFT of the present invention because the masking material used in the process steps according to the present invention need not be left over after completing the structure.

Unlike to a prior art TFT, the channel forming region and the source/drain regions according to the present invention are formed in the same layer. Thus, a favorable joint can be realized between the regions to further improve the TFT characteristics such as the field mobility, the characteristic sub-threshold value, and leak current.

The impurity introduced into the source and drain may be activated by irradiating the ultraviolet radiation, visible light or a near infrared radiation thereto.

The present invention is described in further detail below referring to the preferred embodiment according to the present invention. It should be understood, however, that the present invention is not to be construed as being limited to the examples below.

EXAMPLE 1

A TFT was fabricated according to the process steps listed in FIG. 3. FIGS. 1(A) to 1(D) show the schematically drawn step-sequential cross section structures obtained in a process for fabricating a TFT according to an embodiment of the present invention, up to the fabrication of the metal wiring and electrode 110. The step of forming an ITO pixel electrode 111 is not included in the figures. Referring to FIGS. 1(A) to 1(D), the surface of a tantalum gate electrode was coated with about 200 nm thick anodic oxide film in step 5 to improve the insulating properties. The anodic oxide film comprises an oxide of a material constituting the gate electrode. Impurities were doped by means of ion doping. Four masks in total were used in the entire process comprising 26 steps.

In FIGS. 3 to 6 hereinafter, "sputter", "PCVD", and "RIE" refer to a film deposition process using sputtering, a plasma CVD process, and a reactive ion etching process, respectively. The thickness of the deposited film and other conditions such as the gas used as the material, etc., are also noted after placing a colon (:).

A corresponding prior art process steps are illustrated sequentially in FIGS. 2(A) to 2(D), and the process steps are shown in FIG. 5. Six masks in total were used in the process, and the entire process requires 29 steps in total. It can be seen that the process according to the present invention is shortened as compared with a conventional one.

The present example is described in detail below referring to FIGS. 1(A) to 1(D) and to FIG. 3. A Corning 7059 glass substrate 101 was cleaned (step 1), and a 200 nm thick tantalum film was formed thereon by means of sputtering (step 2). The tantalum film was patterned thereafter using a mask ① (step 3), and was etched using a mixed acid based on phosphoric acid containing 5% of nitric acid (step 4). Then, current was applied to the tantalum gate electrode 102 to effect anodic oxidation, in which the voltage was elevated to a maximum voltage of 120 V to form a 200 nm thick anodic oxide film 103 (step 5). For details of the anodic oxidation process, reference can be made to Japanese patent application Nos. 3-237100 and 3-238713.

The resist was removed thereafter (step 6), and a 200 nm thick silicon nitride film 104 was formed by plasma CVD to provide a gate dielectric (step 7). The substrate temperature was maintained at 300° C. during the CVD process. After cleaning the substrate (step 8), a 30 nm thick amorphous silicon film was deposited by plasma CVD while maintaining the substrate at a temperature of 300° C. (step 9).

The semiconductor region was patterned using a mask ② (step 10), and the amorphous silicon film was etched by reactive ion etching using $CF_4$ gas as the reaction gas (step 11) to form the semiconductor region 105. The remaining resist was removed (step 12), and the substrate was cleaned (step 13).

A 200 nm thick silicon nitride film was deposited by plasma CVD (step 14) while maintaining the substrate temperature to 300° C. Then, the silicon nitride mask was patterned (step 15), and the silicon nitride film was etched using hydrofluoric acid with buffer (step 16) to form a silicon nitride mask 106. A resist 107 about 500 nm in thickness was found to be left over on the silicon nitride mask.

Phosphorus ions were doped by ion doping at a dose of $3\times10^{15}$ cm$-2$ by accelerating them at an energy of 10 keV (step 17) to form the impurity region 108. The substrate was cleaned (step 18), and the remaining resist was removed from the substrate (step 19).

Lamp annealing was effected thereafter using a halogen-tungsten lamp (step 20), and the silicon nitride mask 106 was removed by etching using hydrofluoric acid with buffer (step 21). In the step of lamp annealing (step 20), the intensity of the ultraviolet radiation, the visible light, or the near-infrared radiation was controlled as such that the temperature measured on a monitoring single crystal silicon wafer might fall in the range of from 800 to 1,300° C., representatively, in the range of from 900 to 1,200° C. More specifically, the temperature of a thermocouple buried inside the silicon wafer was monitored, and the signal thus obtained was fed back to the light source of an infrared radiation. The temperature during the process was elevated and lowered according to the program illustrated in FIG. 7(A) or 7(B). The heating rate was constant in a range of from 50 to 200° C./second. The cooling process was effected by air cooling; accordingly, the cooling rate was in the range of from 20 to 100° C./second.

Figure 7A:
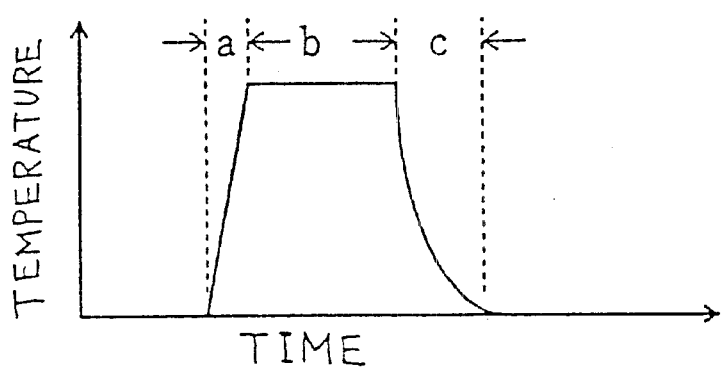
FIGS. 7(A) and 7(B) each show the temperature control in the process for fabricating a TFT according to Example 1 of the present invention.

FIG. 7(A) illustrates a general heating and cooling cycle comprising a heating step a, a holding step b, and a cooling step c. It can be seen, however, that the specimen is heated from room temperature to a high temperature of about 1,000° C., and is then cooled rapidly from the high temperature to room temperature again. Thus, the heating and cooling steps affects the silicon film and the substrate to a considerable extent, thereby increasing the possibility of causing delamination (peeling off) of the silicon film.

Figure 7B:
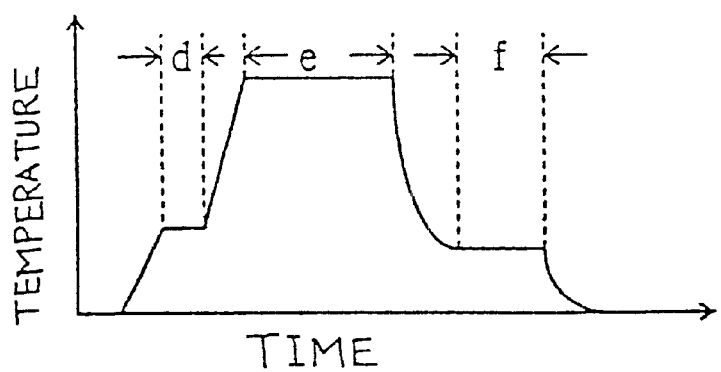

To overcome the problem of delamination, a pre-heating step d or a post-heating step f is provided prior to or subsequent to the holding step as shown in the heating program of FIG. 7(B) to maintain the substrate at a temperature in the range of from 200 to 500° C. and at a temperature not greatly affecting the substrate and the films. The lamp annealing step was effected under a $H_2$ atmosphere. The $H_2$ gas atmosphere may contain from 0.1 to 10% hydrogen chloride, another hydrogen halide, or a compound of fluorine, chlorine, or bromine. The substrate was cleaned thereafter (step 22).

An aluminum coating was deposited thereafter to a thickness of 400 nm by sputtering (step 23), and an aluminum wiring was patterned using a mask ④ (step 24). The aluminum coating was etched thereafter using a mixed acid (step 25) to form an aluminum wiring 110. The remaining resist was removed (step 26). The resulting structure was annealed under a gaseous hydrogen atmosphere at 1 atm and at a temperature of 350° C. for a duration of 30 minutes.

The key in the present example is, in particular, neutralizing the dangling bonds formed in the step of lamp annealing using a ultraviolet radiation, visible light, or near-infrared radiation. Thus, the dangling bonds must be heated at a temperature of from 250 to 400° C. in a hydrogen gas atmosphere for neutralization. Thus was obtained an N-channel TFT.

EXAMPLE 2

A TFT was fabricated according to the process steps listed in FIG. 4. The process steps of the present example are essentially the same as those illustrated in FIGS. 1(A) to 1(D) except that the technique of light exposure from the back is used in the present case. Similar to the case in Example 1, FIG. 4 shows the steps up to the fabrication of the metal wiring and electrode 110. Referring to FIGS. 1(A) to 1(D), the surface of a tantalum gate electrode was coated with about 200 nm thick anodic oxide film in step 5 to improve the insulating properties. The silicon nitride mask was formed by the technique of light exposure from the back. Impurities were introduced by means of ion doping. The number of masks in total was reduced to three by employing the back side light exposure technique. Thus, the process comprises 26 steps.

A corresponding prior art process is illustrated in the process steps in FIG. 6. Three masks in total were used in the process, and the entire process requires 23 steps in total. It can be seen that the process according to the present example as illustrated in FIG. 4 is increased in the number of steps, however, the number of film deposition steps which are the rate limiting steps are decreased to 5 as compared with the conventional process comprising 6 steps of film deposition as illustrated in FIG. 6. Thus, in practice, the productivity is improved.

The present example is. described in further detail below referring to process steps of FIG. 4 and to FIGS. 1(A) to 1(D). A Corning 7059 glass substrate 101 was cleaned (step 1), and a 400 nm thick tantalum film was formed thereon by means of sputtering (step 2). The tantalum film was patterned thereafter using a mask ① (step 3), and was etched using a mixed acid based on phosphoric acid containing 5% of nitric acid (step 4). Then, current was applied to the tantalum gate electrode 102 to effect anodic oxidation, in which the voltage was elevated to a maximum voltage of 120 V to form a 200 nm thick anodic oxide film 103 (step 5).

The resist was removed thereafter (step 6), and a 200 nm thick silicon nitride film 104 was deposited by plasma CVD to provide a gate dielectric (step 7). The substrate temperature was maintained at 300° C. during the CVD process. After cleaning the substrate (step 8), a 30 nm thick amorphous silicon film was deposited by plasma CVD while maintaining the substrate at a temperature of 300° C. (step 9).

The semiconductor region was patterned using a mask ② (step 10), and the amorphous silicon film was etched by reactive ion etching using $CF_4$ gas as the reaction gas (step 11) to form the semiconductor region 105. The remaining resist was removed (step 12), and the substrate was cleaned (step 13).

A 200 nm thick silicon nitride film was deposited by plasma CVD (step 14) while maintaining the substrate temperature to 300° C. Then, the silicon nitride mask was patterned by exposing light from the back side of the substrate having thereon the resist (step 15), and the silicon nitride film was etched using hydrofluoric acid with buffer (step 16) to form a silicon nitride mask 106. A resist 107 about 500 nm in thickness was found to be left over on the silicon nitride mask.

Phosphorus ions were doped by ion doping at a dose of $2\times101^{15}$ cm$-2$ by accelerating them at an energy of 10 keV (step 17) o form the impurity region 108. The substrate was cleaned (step 18), and the remaining resist was removed from the substrate (step 19).

Lamp annealing was effected thereafter using a halogen-tungsten lamp (step 20), and the silicon nitride mask 106 was removed by etching using hydrofluoric acid with buffer (step 21). Lamp annealing was effected under the same conditions as those employed in Example 1. The substrate was cleaned thereafter (step 22).

An aluminum coating was deposited thereafter to a thickness of 400 nm by sputtering (step 23), and an aluminum wiring was patterned using a mask ④ (step 24). The aluminum coating was further etched using a mixed acid (step 25) to form an aluminum wiring 110. The remaining resist was removed (step 26). The resulting structure was annealed under a gaseous hydrogen atmosphere at 1 atm and at a temperature of 350° C. for a duration of 30 minutes. Thus was obtained an N-channel TFT.

As described in the foregoing, the present invention provides, by a simple process, a high quality TFT capable of high speed operation and having a low threshold voltage by establishing source/drain regions of low sheet resistance. It can be seen that the present invention is greatly contributory to the industry.

While the invention has been described in detail and with reference to specific embodiments thereof, it will be apparent to one skilled in the art that various changes and modifications can be made therein without departing from the spirit and scope thereof.

What is claimed is:

1. A semiconductor device comprising:
   a gate electrode formed over a substrate;
   a gate insulating film comprising silicon nitride formed over said gate electrode;
   a semiconductor film comprising silicon formed on said gate insulating film;
   a pair of impurity regions in said semiconductor film and a channel forming region extending between said pair of impurity regions wherein said pair of impurity regions have a higher crystallinity than said channel forming region;
   a silicon nitride layer formed on said channel forming region,
   wherein boundaries between said channel forming region and said pair of impurity regions are aligned with side edges of said silicon nitride layer.

2. A semiconductor device according to claim 1 further comprising at least one electrode electrically connected to one of said impurity regions.

3. A semiconductor device according to claim 1 wherein said substrate is a transparent glass substrate.

4. A semiconductor device according to claim 1 wherein said channel forming region is amorphous.

5. A semiconductor device according to claim 1 wherein said gate electrode comprises a metal having a melting point which resists lamp annealing.

6. A semiconductor device according to claim 1 wherein said gate electrode comprises a material selected from the group consisting of tantalum and titanium.

7. A semiconductor device according to claim 1 wherein said channel forming region is substantially intrinsic.

8. A semiconductor device according to claim 1 wherein said semiconductor device is a semiconductor integrated circuit.

9. A semiconductor device according to claim 1 wherein said semiconductor device is an active matrix circuit.

10. A semiconductor device comprising:
    a gate electrode formed over a substrate;
    a gate insulating film comprising silicon nitride formed over said gate electrode;
    a semiconductor film comprising silicon formed on said gate insulating film;
    a pair of impurity regions in said semiconductor film and a channel forming region extending between said pair of impurity regions wherein said pair of impurity regions have a higher crystallinity than said channel forming region;
    a silicon nitride layer formed on said channel forming region wherein said silicon nitride layer is formed into an island shape in a self-alignment manner with respect to said gate electrode through a back exposure process,
    wherein boundaries between said channel forming region and said pair of impurity regions are aligned with side edges of said silicon nitride layer.

11. A semiconductor device according to claim 10 further comprising at least one electrode electrically connected to one of said impurity regions.

12. A semiconductor device according to claim 10 wherein said substrate is a transparent glass substrate.

13. A semiconductor device according to claim 10 wherein said channel forming region is amorphous.

14. A semiconductor device according to claim 10 wherein said gate electrode comprises a metal having a melting point which resists lamp annealing.

15. A semiconductor device according to claim 10 wherein said gate electrode comprises a material selected from the group consisting of tantalum and titanium.

16. A semiconductor device according to claim 10 wherein said channel forming region is substantially intrinsic.

17. A semiconductor device according to claim 10 wherein said semiconductor device is a semiconductor integrated circuit.

18. A semiconductor device according to claim 10 wherein said semiconductor device is an active matrix circuit.

19. A semiconductor device comprising:
    a gate electrode formed over a glass substrate;
    an insulating film comprising silicon nitride formed over said gate electrode wherein an entire upper surface of said glass substrate is covered by said insulating film;
    a semiconductor film comprising silicon formed over said insulating film;
    a pair of impurity regions in said semiconductor film and a channel forming region extending between said pair of impurity regions wherein said pair of impurity regions have a higher crystallinity than said channel forming region;
    a silicon nitride layer formed on said channel forming region,
    wherein boundaries between said channel forming region and said pair of impurity regions are aligned with side edges of said silicon nitride layer.

20. A semiconductor device according to claim 19 further comprising at least one electrode electrically connected to one of said impurity regions.

21. A semiconductor device according to claim 19 wherein said substrate is a transparent glass substrate.

22. A semiconductor device according to claim 19 wherein said channel forming region is amorphous.

23. A semiconductor device according to claim 19 wherein said gate electrode comprises a metal having a melting point which resists lamp annealing.

24. A semiconductor device according to claim 19 wherein said gate electrode comprises a material selected from the group consisting of tantalum and titanium.

25. A semiconductor device according to claim 19 wherein said channel forming region is substantially intrinsic.

26. A semiconductor device according to claim 19 wherein said semiconductor device is a semiconductor integrated circuit.

27. A semiconductor device according to claim 19 wherein said semiconductor device is an active matrix circuit.

28. A semiconductor device comprising:
    a gate electrode formed over a substrate;
    an anodic oxide film formed on said gate electrode wherein said anodic oxide film comprises an oxide of a material of the gate electrode;

a gate insulating film comprising silicon nitride formed over said gate electrode;

a semiconductor film comprising silicon formed on said gate insulating film;

a pair of impurity regions in said semiconductor film and a channel forming region extending between said pair of impurity regions wherein said pair of impurity regions have a higher crystallinity than said channel forming region;

a silicon nitride layer formed on said channel forming region wherein said silicon nitride layer is formed into an island shape in a self-alignment manner with respect to said gate electrode and said anodic oxide film through a back exposure process, wherein boundaries between said channel forming region and said pair of impurity regions are aligned with side edges of said silicon nitride layer.

29. A semiconductor device according to claim 28 further comprising at least one electrode electrically connected to one of said impurity regions.

30. A semiconductor device according to claim 28 wherein said substrate is a transparent glass substrate.

31. A semiconductor device according to claim 28 wherein said channel forming region is amorphous.

32. A semiconductor device according to claim 28 wherein said gate electrode comprises metal having a melting point which resists lamp annealing.

33. A semiconductor device according to claim 28 wherein said gate electrode comprises a material selected from the group consisting of tantalum and titanium.

34. A semiconductor device comprising:

a gate electrode formed over a substrate;

a gate insulating film formed over said gate electrode;

a semiconductor film comprising silicon formed on said gate insulating film;

a pair of impurity regions in said semiconductor film and a channel forming region extending between said pair of impurity regions wherein said pair of impurity regions have a higher crystallinity than said channel forming region;

an insulating layer formed on said channel forming region, wherein boundaries between said channel forming region and said pair of impurity regions are aligned with side edges of said insulating layer.

35. A semiconductor device according to claim 34 further comprising at least one electrode electrically connected to one of said impurity regions.

36. A semiconductor device according to claim 34 wherein said substrate is a transparent glass substrate.

37. A semiconductor device according to claim 34 wherein said channel region is amorphous.

38. A semiconductor device according to claim 34 wherein said gate electrode comprises a metal having a melting point which resists lamp annealing.

39. A semiconductor device according to claim 34 wherein said gate electrode comprises a material selected from the group consisting of tantalum and titanium.

40. A semiconductor device according to claim 34 wherein said channel forming region is substantially intrinsic.

41. A semiconductor device according to claim 34 wherein said semiconductor device is a semiconductor integrated circuit.

42. A semiconductor device according to claim 34 wherein said semiconductor device is an active matrix circuit.

43. A semiconductor device comprising:

a gate electrode formed over a glass substrate;

an insulating film formed over said gate electrode wherein an entire upper surface of said glass substrate is covered by said insulating film;

a semiconductor film comprising silicon formed over said insulating film;

a pair of impurity regions in said semiconductor film and a channel forming region extending between said pair of impurity regions wherein said pair of impurity regions have a higher crystallinity than said channel forming region;

an insulating layer formed on said channel forming region, wherein boundaries between said channel forming region and said pair of impurity regions are aligned with side edges of said insulating layer.

44. A semiconductor device according to claim 43 further comprising at least one electrode electrically connected to one of said impurity regions.

45. A semiconductor device according to claim 43 wherein said substrate is a transparent glass substrate.

46. A semiconductor device according to claim 43 wherein said channel forming region is amorphous.

47. A semiconductor device according to claim 43 wherein said gate electrode comprises a metal having a melting point which resists lamp annealing.

48. A semiconductor device according to claim 43 wherein said gate electrode comprises a material selected from the group consisting of tantalum and titanium.

49. A semiconductor device according to claim 43 wherein said channel forming region is substantially intrinsic.

50. A semiconductor device according to claim 43 wherein said semiconductor device is a semiconductor integrated circuit.

51. A semiconductor device according to claim 43 wherein said semiconductor device is an active matrix circuit.

* * * * *